United States Patent [19]

Celine

[11] Patent Number: 4,857,828
[45] Date of Patent: Aug. 15, 1989

[54] METHOD AND APPARATUS FOR DETECTING PRESENCE OF OBJECTS

[75] Inventor: David H. Celine, Durban, South Africa

[73] Assignee: Control Logic (Proprietary) Limited, Duran, South Africa

[21] Appl. No.: 55,417

[22] Filed: May 29, 1987

[30] Foreign Application Priority Data

May 30, 1986 [ZA] South Africa .................. 86/4045

[51] Int. Cl.$^4$ ............................................. G01R 27/26
[52] U.S. Cl. ................................. 324/61 R; 194/211; 194/213; 340/870.37
[58] Field of Search ............ 324/61 R, 61 P, DIG. 1; 340/870.37; 194/211, 213; 283/81

[56] References Cited

U.S. PATENT DOCUMENTS

| | | | |
|---|---|---|---|
| 3,631,617 | 1/1972 | Pekko | 283/81 X |
| 3,926,291 | 12/1975 | Burke et al. | 194/213 |
| 4,339,709 | 7/1982 | Brihier | 324/61 R |
| 4,374,383 | 2/1983 | Polk et al. | 324/61 R X |
| 4,511,616 | 4/1985 | Pitts et al. | 283/81 X |
| 4,523,195 | 6/1985 | Tanaka et al. | 340/870.37 |
| 4,543,526 | 9/1985 | Burckhardt et al. | 324/61 R |

FOREIGN PATENT DOCUMENTS

| | | |
|---|---|---|
| 0054661 | 6/1982 | European Pat. Off. . |
| WO86/05019 | 8/1986 | PCT Int'l Appl. . |
| 1375087 | 9/1972 | United Kingdom . |
| 1386117 | 3/1975 | United Kingdom . |
| 1479077 | 7/1977 | United Kingdom . |
| 1523943 | 9/1978 | United Kingdom . |
| 2046968 | 11/1980 | United Kingdom . |
| 2129563 | 5/1984 | United Kingdom . |

Primary Examiner—Reinhard J. Eisenzopf
Assistant Examiner—Robert W. Mueller
Attorney, Agent, or Firm—Bucknam and Archer

[57] ABSTRACT

A system for capacitively detecting the presence of a tape cassette within a vending machine or the like. The testing system within the machine employs an ac source connected to a source electrode and a detector connected to a detector electrode. A coded pattern is provided along the side wall of the cassette with a pair of series connected electrodes arranged to oppose the electrodes of the testing system. When aligned, the capacitances formed between the testing system electrode and the coded pattern complete an electrical circuit from the source to the detector through the cassette. The completing of the circuit indicator the presence of the cassette.

10 Claims, 1 Drawing Sheet

METHOD AND APPARATUS FOR DETECTING PRESENCE OF OBJECTS

INTRODUCTION TO THE INVENTION

This invention relates to a method and apparatus for the detection of the presence of and object in a pre-determined position.

This facility is particularly required in vending machines of various types, and will be described in this application with reference to its use with the vending of the use of tape cassettes. One of the problems of such vending machines is to establish reliably whether one of the vended objects is in position in a machine, and thus whether it is either ready for sale or hire, or has been returned after being borrowed.

Systems used for this purpose in the past include a bar coding system, as well as sets of contacts which connect together when the object is located in a pre-determined condition, and create a circuit which is then tested for soundness. Problems which arise with these systems are the complexity of the reading device for the first, and the practical difficulties and wear and tear of the second.

OBJECT OF THE INVENTION

It is an object of this invention to provide a method and apparatus for detecting the presence of an object in a pre-determined position.

SUMMARY OF THE INVENTION

In accordance with this invention a method of detecting the presence of an object in a pre-determined position comprises:

locating electrically connected surfaces in a coded pattern on the object, the surfaces each defining first electrodes of respective capacitors;

locating at the pre-determined position, and in accordance with the coded pattern on the object, further surfaces, which will define opposite electrodes of said respective capacitors when the object is in the pre-determined position; and, testing by means of an alternating electrical signal source and detector, applied at the pre-determined position, whether the opposite and first electrodes match to form capacitances and thereby complete an electrical circuit from source to detector through the object.

Further features of the method of the invention provide for a step whereby the first electrode surfaces are located in spaced apart manner to define therebetween a coded pattern of non-capacitive surface area, and additional opposite electrode surfaces are located to be adjacent the non-capacitive area when the object is in the pre-determined position, and there is a detection of the absence of said electrical signal at these additional opposite electrodes.

Further features of the invention provides for the spacing between first and opposite electrode surfaces to be controlled to cause a pre-determined capacitance value, and for there to be testing of these said circuits which includes testing for the said predetermined capacitance value, preferably by means of indirect impedance measurement.

There is still further provided for the surfaces to be located on the object by means of adhesive tape having metallised surface portions.

The invention extends to surfaces adapted for use in the method, and particularly to such strips or stickers which have conductive patterns defining the electrode surfaces thereon.

There is particularly provided also for these surfaces to be sufficiently opaque or overprinted so that the conductive electrode surfaces therein cannot be easily detected, and further for the strip to be adapted to be at least difficult to remove from any area that it has been located on, and further to be adapted to be difficult to remove without being substantially destroyed.

There is also provided for a tape cassette or other object having the conductive pattern located behind a side wall thereof which serves as the spacing between the first and opposite electrodes, or to be formed within the wall or other side surface of the object itself, during manufacture of the object.

Still further, the invention provides for apparatus for recognising the presence of an object in a pre-determined position, comprising: first electrically connected surfaces in a coded pattern locatable on the object, the first surfaces each defining first electrodes of respective capacitors; further surfaces located at the pre-determined position, and in accordance with the coded pattern to define opposite electrodes of said respective capacitors when an object operatively bearing the first surfaces is in the pre-determined position; and, testing means including an alternating electrical signal source and detector, connected at the pre-determined position, and arranged to test whether the opposite and first electrodes match to form capacitances and thereby complete an electrical circuit from source to detector through the object.

Preferably the testing means is arranged to test whether capacitances formed between first and opposite electrodes are of a predetermined value.

BRIEF DESCRIPTION OF THE DRAWINGS

A preferred embodiment of the invention is described below by way of example only, and with reference to the accompanying drawings, in which.

DETAILED DESCRIPTION OF THE DRAWINGS

Figure 1:
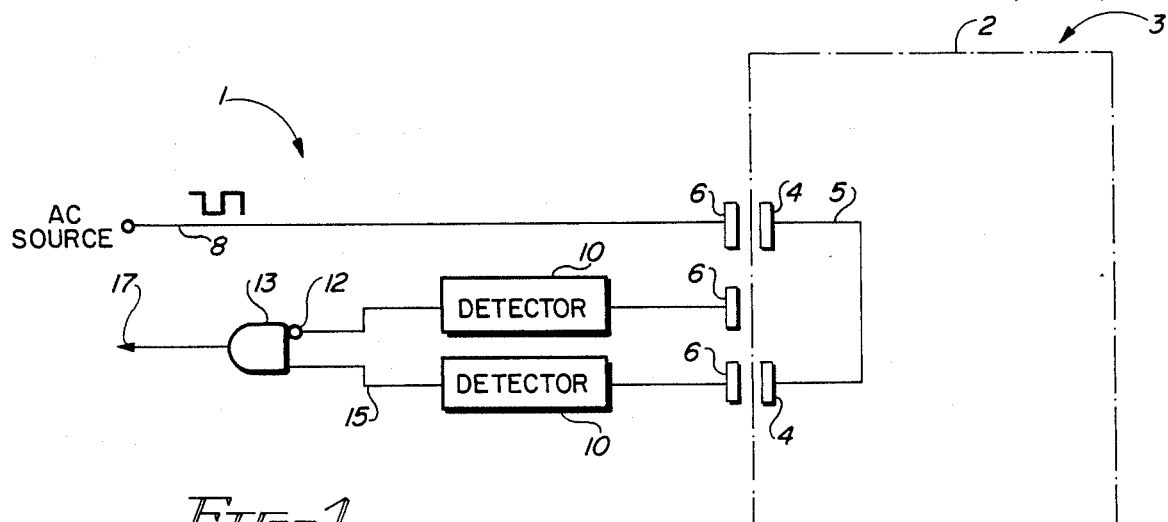
FIG. 1 is a circuit block diagram of apparatus of the invention.

Referring to FIG. 1, apparatus (1) is used for detecting the presence of a cassette tape shown in outline by numeral (2) at a pre-determined position (3), which is a specific location in a video cassette vending machine (not shown).

The cassette (2) has two spaced apart metallic surfaces (4) located on the edge surface of the cassette at the position (3), and the surfaces are electrically connected along line (5). At the position (3), where the cassette is to be located, there are three similar spaced apart conductive surfaces (6) located in a row on a plane parallel with cassette edge and with the two outermost surfaces (6) each matching one of the surfaces (4). The middle surface (6) is opposite the space between the two surfaces (4). The opposing surfaces when located together with the object in the pre-determined position, as illustrated, form capacitances. One of the outermost electrode surfaces (6) is connected to a source (8) of an alternating electrical signal and each of the other electrode surfaces (6) is connected to a detector (10) for detecting the presence of the signal from the source (8). The detector (10) for the middle surface (6) is taken through an inverting input (12) and then into an 'AND' gate (13) which has a further input the output (15) from the other detector (10). The output (17) of the gate (13) will thus only indicate the presence of a cassette if the detector (10) for the outermost electrode (6) has the signal present at its corresponding electrode surface, and the detector (10) for the middle electrode is not indicating an electrical signal.

Figure 2:
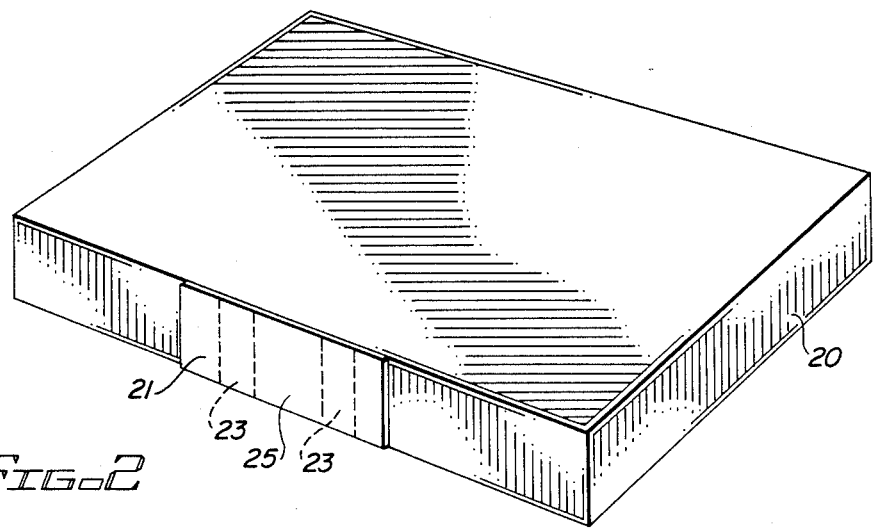
FIG. 2 is an isometric view of a coded cassette according to the invention; and, FIG. 3 is a diagrammatic side view of the mounting of capacitor electrodes according to the invention.

Referring to FIG. 2, a tape cassette (20) is shown with a metallised sticker (21) thereon which has within the sticker construction two metallised strips (23) which form the capacitive electrode srufaces (4) in use. The surfaces (23) are spaced apart to leave a void (25) which will match up with a middle detector surface (6) in the detection device.

Figure 3:
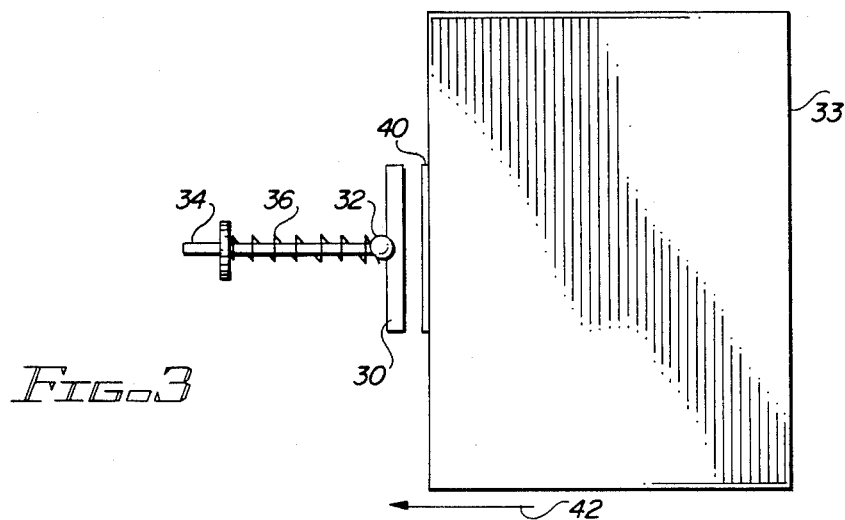

Referring to FIG. 3, a method of mounting for the opposite electrode surfaces (6) of FIG. 1 is shown. These surfaces are located on a planar base (30) which is connected by a universal ball joint mounting (32) to an axially slidable rod (34). The rod which is spring biased by means of spring (36) towards the position of a tape cassette (38). The tape cassette (38) has its rear surface fitted with a metallised sticker (40) as described with reference to FIG. 2 and on inserting the tape casssette in the direction (42) into a predetermined position in a machine, the sticker (40) will move up against the surface (30) and the various electrode surfaces will match up. The surface (30) will make planar contact with the sticker surface (40) owing to the universal joint (32), and to the spring biasing (36), which enables the surface (30) to move slightly backwards and to adjust to provide an accurate match of the electrode surfaces.

Variations may be made to the above embodiment without departing from the scope of the invention. For example the pattern of electrode surfaces and gaps may be varied and be as intricate as desired in order to provide a specific code for a particular application. Furthermore, the various electronic functions which can be provided by way of 'AND/'OR' functions in detecting the presence or absence of a signal, can be varied to provide a further coded output signal which will indicate a correct location of a tape cassette. The location of the electrode surfaces on the tape and at the pre-determined position may be by any convenient means, and a sticker is only a preferably choice. The sticker however may be located behind a surface in a cassette tape, or any other surface of the object. The wall of the object or tape then provides the spacing between the electrodes, or the coded electrode surfaces may be located within the wall during manufacture or otherwise.

I claim:

1. A method of detecting the presence of a tape cassette in a predetermined position comprising: locating first electrically connected surfaces in a coded pattern on said tape cassette, the surfaces each defining first electrodes of respective capacitors; locating at the predetermined position, and in accordance with the coded pattern on said tape cassette, second surfaces, which define opposite electrodes of said respective capacitors when the tape cassette is in the predetermined position; and, testing by means of an alternating electrical signal source and detector, applied at the predetermined position, whether the opposite and first electrodes match to form capacitances thereby completing an electrical circuit from source to detector through the tape cassette, said first electrically connected surfaces being located behind a side wall of said tape cassette which serves as a spacing between the first and opposite electrodes in use.

2. The method as claimed in claim 1 wherein said first electrode surfaces are located in spaced apart manner to define therebetween a coded pattern of non-capacitive surface area, and said opposite electrode surfaces are located to be adjacent the non-capacitive area when said tape cassette is in the predetermined position and detecting the absence of said electrical signal at said opposite electrodes.

3. The method as claimed in claim 2 wherein the spacing between said first and opposite electrode surfaces are controlled to cause a predetermined capacitance value, and the testing of the said circuits includes testing of the said predetermined capacitance value.

4. The method as claimed in claim 3 wherein the surfaces are located on said tape cassette by means of adhesive tape having metallized surface portions.

5. The method as claimed in claim 1 wherein the surfaces are sufficiently opaque or overprinted whereby the conductive electrode surfaces are not easily detected.

6. An apparatus for recognizing the presence of a tape cassette which comprises a tape cassette having a side wall; means along said cassette side wall defining first and second distinct conductive surfaces with a non-conductive area adjacent thereto and an electrical connecting line between said first and second conductive surfaces with a non-conducting spacing means overlying said first and second conductive surface; third, fourth and fifth conductive surfaces, said third and fifth conductive surface being respectively positioned directly opposite said first and second conductive surfaces and said fourth conductive surface positioned directly opposite said non-conductive area when said tape cassette is properly positioned relative to said third, fourth and fifth conductive surfaces for recognition; a source of alternating current in series with said third conductive surface; and detector means for recognizing the presence of said tape cassette by detecting the presence of current flow through a circuit defined by said third, first, second and fifth conductive surfaces.

7. The apparatus according to claim 6 wherein said detector means further comprises means for recognizing the absence of current flow through said fourth conductive surface.

8. The apparatus according to claim 6 wherein said non-conductive spacing means comprises a portion of said tape cassette side wall.

9. The apparatus according to claim 6 wherein said first and second conductive surfaces are disposed along said tape cassette side wall.

10. The apparatus according to claim 18 wherein said third, fourth and fifth conductive surfaces are located on a planar base (30), said planar base being connected to an axially slidable rod (34) by means of a universal ball joint (32), said rod being spring biased towards said tape cassette.

* * * * *